United States Patent [19]

McClure et al.

[11] Patent Number: 5,265,100
[45] Date of Patent: Nov. 23, 1993

[54] SEMICONDUCTOR MEMORY WITH IMPROVED TEST MODE

[75] Inventors: David C. McClure, Carrollton; Thomas A. Coker, Irving, both of Tex.

[73] Assignee: SGS-Thomson Microelectronics, Inc., Carrollton, Tex.

[21] Appl. No.: 552,567

[22] Filed: Jul. 13, 1990

[51] Int. Cl.$^5$ .............................................. G01R 31/28
[52] U.S. Cl. ................................. 371/21.2; 365/201; 371/68.1
[58] Field of Search ............. 365/201; 371/21.1, 21.2, 371/68.1, 68.2, 68.3

[56] References Cited

U.S. PATENT DOCUMENTS

| | | | |
|---|---|---|---|
| 4,654,849 | 3/1987 | White, Jr. et al. | 371/21.1 |
| 4,744,061 | 5/1988 | Takemae et al. | 365/201 |
| 4,860,259 | 8/1989 | Tobita | 365/201 |
| 4,873,669 | 10/1989 | Furutani et al. | 365/189 |
| 4,896,322 | 1/1990 | Kraus et al. | 371/21.2 |
| 5,060,230 | 10/1991 | Arimoto et al. | 371/21.2 |
| 5,072,137 | 12/1991 | Slemmer | 371/21.1 |
| 5,072,138 | 12/1991 | Slemmer et al. | 371/21.1 |
| 5,075,892 | 12/1991 | Choy | 371/21.2 |

FOREIGN PATENT DOCUMENTS 0313040 4/1989 European Pat. Off. .

OTHER PUBLICATIONS

Nishimura, et al., "A Redundancy Test-Time Reduction Technique in 1-Mbit DRAM with a Multibit Test Mode", *IEEE Journal of Solid-State Circuits* vol. 24, No. 1, (Feb. 1989) pp. 43-49.

McAdams, et al., "A 1-Mbit CMOS Dynamic RAM With Design-For Test Functions", *IEEE Journal of Solid-State Circuits* (Oct. 1986), vol. SC-21, No. 5,, pp. 635-642.

Shimada, et al., "A 46-ns 1-Mbit CMOS SRAM", *IEEE Journal of Solid-State Circuits* (Feb. 1988), vol. 23, No. 1, pp. 53-58.

Primary Examiner—Charles E. Atkinson
Attorney, Agent, or Firm—Rodney M. Anderson; Lisa K. Jorgenson; Richard K. Robinson

[57] ABSTRACT

An integrated circuit memory is disclosed which has a parallel test read mode. The memory includes comparators for comparing multiple data words, on a bit-by-bit basis, during the parallel read mode, with the result of the comparison used to enable or disable the output buffers. In test mode, in the event of a failed parallel test comparison, the comparator causes the output buffers to go into a high-impedance state; for a passing parallel test, the actual data state is presented by the output terminals The comparison circuitry is in parallel with the output data path, so that the output data path is not adversely affected by the test circuitry, and so that the access time in test mode is the same as the access time during normal operation (assuming a passing test). The technique may be adapted to wide parallel test schemes.

5 Claims, 4 Drawing Sheets

SEMICONDUCTOR MEMORY WITH IMPROVED TEST MODE

This invention is in the field of semiconductor memories, and is specifically directed to special test modes for such memories.

BACKGROUND OF THE INVENTION

In modern high density memories, such as random access memories having $2^{20}$ bits (1 Megabit) or more, the time and equipment required to test functionality and timing of all bits in the memory constitutes a significant portion of the manufacturing cost. Accordingly, as the time required for such testing increases, the manufacturing costs also increase. Similarly, if the time required for the testing of the memory can be reduced, the manufacturing cost of the memories is similarly reduced. Since the manufacturing of memory devices is generally done in high volume, the savings of even a few seconds per device can result in significant cost reduction and capital avoidance, considering the high volume of memory devices produced.

Random access memories (RAMs) are especially subject to having significant test costs, not only because of the necessity of both writing data to and reading data from each of the bits in the memory, but also because RAMs are often subject to failures due to pattern sensitivity. Pattern sensitivity failures arise because the ability of a bit to retain its stored data state may depend upon the data states stored in, and the operations upon, bits which are physically adjacent to a particular bit being tested. This causes the test time for RAMs to be not only linearly dependent upon its density (i.e, the number of bits available for storage) but, for some pattern sensitivity tests, dependent upon the square (or 3/2 power) of the number of bits Obviously, as the density of RAM devices increases (generally by a factor of four, from generation to generation), the time required to test each bit of each device in production increases at a rapid rate.

It should be noted that many other integrated circuit devices besides memory chips themselves utilize memories on-chip. Examples of such integrated circuits include many modern microprocessors and microcomputers, as well as custom devices such as gate arrays which have memory embedded therewithin Similar cost pressures are faced in the production of these products as well, including the time and equipment required for testing of the memory portions.

A solution which has been used in the past to reduce the time and equipment required for the testing of semiconductor memories such as RAMs is the use of special "test" modes, where the memory enters a special operation different from its normal operation. In such test modes, the operation of the memory can be quite different from that of normal operation, as the operation of internal testing can be done without being subject to the constraints of normal operation.

An example of a special test mode is an internal "parallel", or multi-bit, test mode. Conventional parallel test modes allow access to more than one memory location in a single cycle, with common data written to and read from the multiple locations simultaneously. For memories which have multiple input/output terminals, multiple bits would be accessed in such a mode for each of the input/output terminals, in order to achieve the parallel test operation. This parallel test mode of course is not available in normal operation, since the user must be able to independently access each bit in order to utilize the full capacity of the memory. Such parallel testing is preferably done in such a way so that the multiple bits accessed in each cycle are physically separated from one another, so that there is little likelihood of pattern sensitivity interaction among the simultaneously accessed bits. A description of such parallel testing may be found in McAdams et al., "A 1-Mbit CMOS Dynamic RAM With Design-For-Test Functions", *IEEE Journal of Solid-State Circuits*, Vol SC-21, No. 5 (October 1986), pp. 635-642.

As described in this article, conventional parallel test operations may be done in one of two ways. A first one of these methods merely compares the data state read from each of the multiple simultaneously accessed bits with one another. If all of the simultaneously accessed bits have the same data, the test operation passes. The accuracy of this test is based on the assumption that not all of the bits would fail in the same way at the same time. While such an assumption may not always be valid, such as in the case that the data path circuitry is faulty, this parallel test method can be implemented relatively easily, and the testing of common circuitry such as in the data path can be performed separately, so that the accuracy of the overall test sequence is quite high.

The second method for parallel test, commonly referred to as "expected data parallel test", is performed by comparing the data presented by the accessed bits against one another, and also against the contents of an on-chip register to determine not only that the same data was read from all accessed bits, but also that the data state read was the correct data state. Such a parallel test provides improved accuracy in its result, due to the additional comparison, at a cost of increased on-chip circuitry necessary implemented for its implementation.

For either case, the results of the on-chip comparison must be communicated externally from the chip, for example to automated test equipment that is exercising the chip. In the McAdams et al. article cited hereinabove, in the non-expected data mode, the outputs are driven to a high logic level for a passing parallel test and to a low logic level for a failing parallel test. Accordingly, the actual data state of the storage cells is not output at the output terminals in such a parallel test. In this implementation, if for some reason all of the tested locations had the same data state and if that data state were the incorrect one, the memory would communicate a high logic level at the output, indicating that the test had passed.

In the expected data test, the implementation disclosed in the McAdams et al. article enables the output to match the expected data for passing locations and to present the complement of the expected data for failing locations. However, this requires that the automated test equipment, or end system as the case may be, be able to itself store the expected data and compare it to the data received at the output terminals of the memory device. Accordingly, this adds complexity to the test hardware required for the parallel test in the expected data mode. Alternatively, as described in U.S. Pat. Nos. 4,654,849 and 4,860,259, in the expected data mode a comparator may present, at the output terminal, a first logic level for a pass and a second logic level for a fail, similarly as in the non-expected data mode described above, but of course the actual data state stored by the memory cells would in such a case not be presented at the output.

Another technique for communicating the results of the comparison in parallel test mode is to use a dedicated terminal (e.g., a package pin or bond pad, as the case may be) to communicate the results of the on-chip parallel test comparison This technique is especially useful during functional probe test of the memory, as a dedicated terminal may be accessed when the chip is still in wafer form, prior to its encapsulation or other packaging. However, significant test time also occurs after packaging, during which the parallel test feature is also useful. In order to use a dedicated test result terminal for package test, it is therefore necessary that the package have a pin or other external terminal for this function. Due to the desires of the system designer that the circuit package be as small as possible, with as few connections as possible, the use of a dedicated pin for test result communication is therefore undesirable.

Another known technique for communicating the result of the on-chip parallel test uses an existing terminal, one which has a function during normal operation, to present a data state corresponding to the result of the test. The terminal used is often an address terminal, since one or more of the address bits are "don't cares" in the parallel test mode. The results of the test are communicated at this terminal, for example, by setting a "1" on the terminal if all of the accessed bits presented the same data (and matched the expected data, if appropriate) and a "0" if one or more of the accessed bits had a data state different from the others. However, such an arrangement requires the chip design to incorporate a dual function for a terminal, adding to the circuit complexity, chip size, and perhaps, due to additional loading, adversely affecting device performance.

Another known technique for communicating the parallel test result generates a high impedance state on the output terminal when the comparison is false. Such a technique is described in Shimada et al., "A 46-ns 1-Mbit CMOS SRAM", *IEEE Journal of Solid-State Circuits*, Vol. 23, No. 1, (Feb. 1988) pp. 53-58. In this technique, applied to a multiple output RAM (such as a by-four or by-eight RAM) where the parallel test is accomplished by simultaneously accessing multiple bits for each output, the output terminal for which the comparison is false is placed in a high-impedance state.

As described in this article relative to FIG. 5, parallel test is accomplished in this device by the simultaneous access of four of the array blocks. The comparison of the data retrieved from the four accessed bits is accomplished by arbiter buffers, which drive lines BUS and BUS_ in wired-AND fashion. As noted on page 55, since the p-channel pull-up transistors in the arbiter buffers are small, if any of the four selected cells fails (e.g., has a "0" instead of a "1"), both of lines BUS and BUS_ will be at a low logic level. By the operation of the NAND gates which, in such a case, will provide a "1" input to both of the NORs driving the pull-up and pull-down transistors of the output buffer, such a failure will cause a high-impedance state at the output of the device.

As is evident from this construction, however, it is apparent that the arbiter buffers are connected in series in the data path between the sense amplifiers and the data out terminal both for normal and parallel test modes. Accordingly, the propagation delay required by the arbiter buffers is seen during normal operation, so that an access time penalty is paid in order to implement the parallel test comparison. This penalty is made worse by the construction of the arbiter buffers in such a way that the p-channel pull-up transistors are sufficiently small so that a single n-channel pull-down transistor (in the example of a test failure due to reading a "0" instead of a "1") can pull down line BUS or BUS_ which is being pulled high by the other three p-channel transistors. This small size for the pull-up devices will, of course, result in a slow transition time for a line BUS or BUS_ going from a low to a high logic level for a read operation.

The problem discussed hereinabove relative to the small p-channel pull-up transistor will become even worse if the parallel test design goes from a by-four test to a by-eight or wider parallel test operation. This is because a single n-channel transistor must be capable of pulling down a node being pulled up by seven, or fifteen in the case of a by-sixteen test, p-channel pull-up transistors. Accordingly, the scheme described in the Shimada et al. paper will become less useful for wider parallel test operations. Of course, as memories become larger and larger, it will become desirable to test even more bits in parallel.

It is therefore an object of this invention to provide a circuit for communicating the result of a parallel test operation on existing output terminals of the device, but where the data state of a passing test appears at the output terminals.

It is a further object of this invention to communicate this result by way of a high impedance state at the output terminal.

It is a further object of this invention to provide such a circuit in such a manner that the access time of the device in normal operation is not significantly affected by the implementation of the circuit.

It is a further object of this invention to provide such a circuit which can be scaled to increasingly wider parallel test schemes without significantly impacting the normal operating characteristics of the device.

It is a further object of this invention to provide such a circuit which, in test mode, will present the actual stored data in the event of a pass of the test.

It is a further object of this invention to provide such a circuit which can perform the parallel test comparison without requiring the use of complementary data lines carrying a differential signal.

It is a further object of this invention to provide such a circuit which can be used not only on memory integrated circuits for parallel test, but also for test modes on integrated circuits which include memories embedded therewithin.

Other objects and advantages of this invention will become apparent to those of ordinary skill in the art having reference to this specification together with the drawings.

SUMMARY OF THE INVENTION

The invention may be incorporated into an integrated circuit memory having a parallel test mode which matches the data from a plurality of simultaneously addressed locations against one another, and possibly against an expected data value. The invention may be incorporated in such a memory by comparison circuitry connected in parallel with the data output path. The comparison circuitry compares the data read simultaneously from a number of memory locations against one another. Based on the results of this comparison, in the event of a failed comparison (i.e., not all of the sensed data states are equal) a signal is generated which places an output terminal in a high impedance state. Since the logic path for the comparison of the multiple data words is in parallel with the path for the output of data from the memory, the access time of the memory in normal operation is not compromised by the presence of the comparison circuitry. The invention may be implemented into a wide word memory, where a parallel test is done to multiple data words at a time, with multiple bits compared against one another for each position in the word.

DETAILED DESCRIPTION OF THE PREFERRED EMBODIMENT

Figure 1:
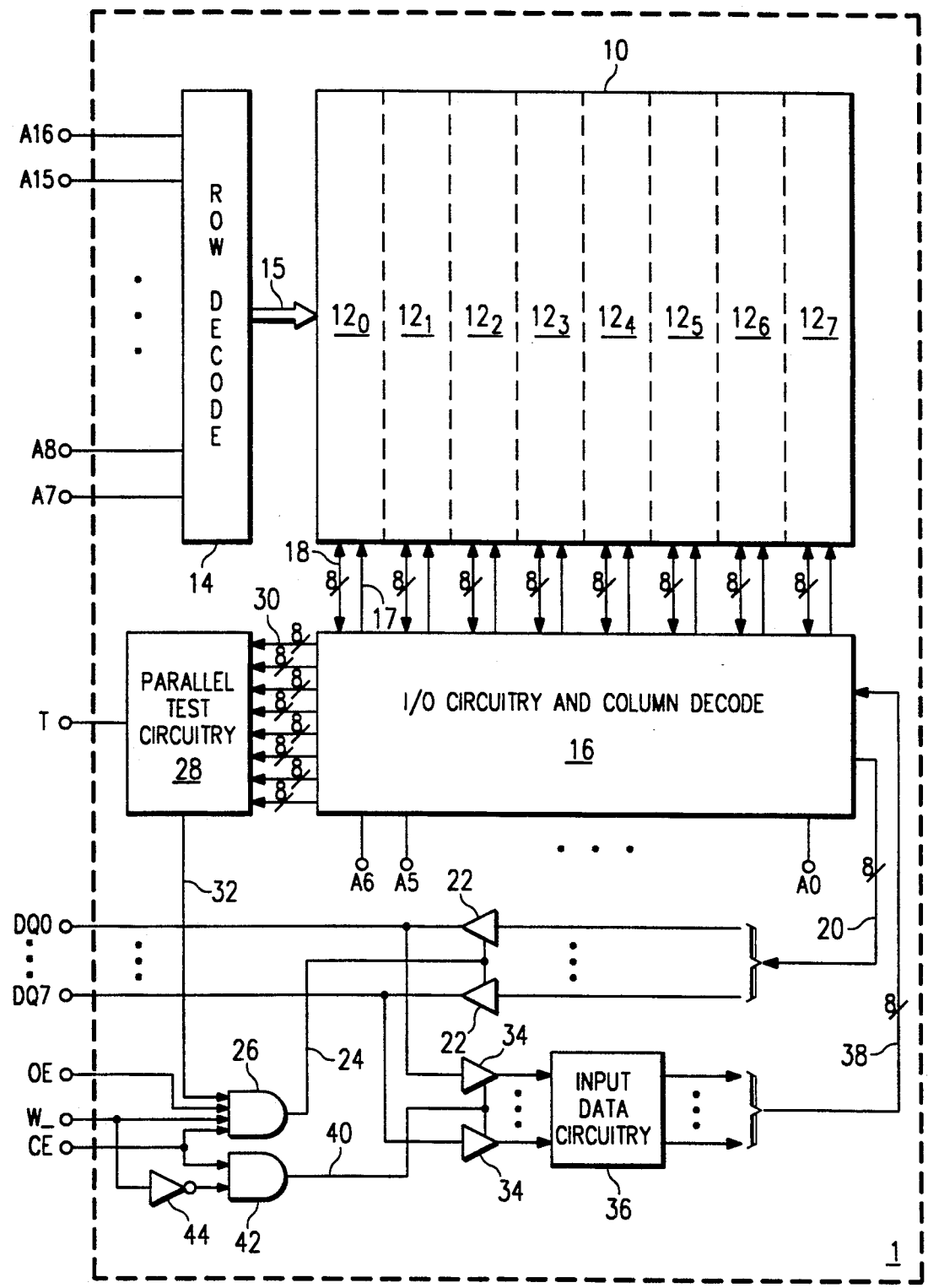
FIG. 1 is an electrical diagram, in block form, of a memory device incorporating the preferred embodiment of the invention.

Referring now to FIG. 1, a block diagram of an integrated circuit memory 1 incorporating the preferred embodiment of the invention described herein will be discussed. Memory is an integrated circuit memory, for example a static random access memory (SRAM), having $2^{20}$, or 1,048,576, storage locations or bits. Memory 1 in this example is a wide-word memory, organized as $2^{17}$, or 128 k, addressable locations of eight bits each. Accordingly, for example in a read operation, upon the access of one of the memory locations, eight data bits will appear at the eight input/output terminals DQ0 through DQ7. Memory 1, in this example, includes an array 10 which has 1024 rows of 1024 columns, with eight columns accessed in each normal memory operation.

In this example of memory 1, memory 10 is divided into eight sub-arrays $12_0$ through $12_7$, each of which have 1024 rows and 128 columns. For purposes of reducing the power consumed during active operation, in this embodiment only one of the sub-arrays 12 is energized during each active cycle, with the selection of the sub-array 12 to be energized determined by the desired memory address (i.e., three bits of the column address). Accordingly, as will be further described hereinbelow, during a normal memory operation such as a read, all eight bits of the accessed memory location will be located in the same sub-array 12.

Memory 1 includes seventeen address terminals A0 through A16, for receiving the seventeen address bits required to specify a unique memory address. In the conventional manner, ten of these address terminals (A7 through A16) are received by row decoder 14, for selecting the one of the 1024 rows in array 10 to be energized by row decoder 14 via bus 15.

Also in the conventional manner, the remaining seven address terminals (A0 through A6) are received by input/output circuitry and column decoder 16 to select one of sub-arrays 12 by way of control lines 17, and to select the desired columns therein according to the column address value. As is conventional in the art, the signals received at the address terminals are generally buffered prior to being received by the decoders, such buffering not shown in FIG. 1 for purposes of clarity. As noted above, for purposes of reducing power consumption, memory 1 according to this embodiment energizes only one of sub-arrays 12, selected according to the three most significant column address bits. In this embodiment, repeaters (not shown) are present between sub-arrays 12 for controlling the application of the energized word line within the sub-array 12. In this way, the column address (particularly the three most significant bits) controls the application of the word line so that only that portion of the word line in the selected sub-array 12 is energized through the memory operation cycle. Column decoder 16 also selects eight of the 256 columns in the selected sub-array 12, according to the value of the remaining bits of the column address. In this embodiment, also for purposes of reducing active power consumption, only those sense amplifiers (not shown) in the selected sub-array 12 which are associated with the desired memory bits are energized. The sense amplifiers so selected by column decoder 16 are then in communication with input/output circuitry and column decoder 16 via local data lines 18, through which the reading of data from or writing of data to the eight selected memory cells in array 10 may be done in the conventional manner.

Of course, many alternative organizations of memory 1 may be used in conjunction with the invention described herein. Examples of such organizations would include by-one memories, where a single bit is input to or output from in normal operation In addition, wide-word memories where each sub-array is associated with one of the input/output terminals, and memories where the entire array is energized during normal operation, may alternatively be used. As mentioned hereinabove, of course, other memory types such as dynamic RAMs, EPROMs, and embedded memories, each with organization of their own, may also benefit from this invention.

Circuitry for controlling the communication of data between input/output circuitry and column decoder 16 of memory 1 is also schematically illustrated in FIG. 1. It is of course contemplated that other control circuitry for controlling the operation of memory 1 as is conventional will also be incorporated into memory such circuitry is not shown in the Figure for purposes of clarity. Output data bus 20, which is eight bits wide in this example, is driven by input/output circuitry and column decoder 16, in a read operation, with the data states of the memory location accessed according to the memory address. Each line of output data bus 20 is received by non-inverting output buffer 22, which drives the output terminal DQ with the correct data state, at levels and currents corresponding to the specifications of memory 1. Each of output buffers 22 are enabled by a signal on line 24 from AND gate 26. The signal on line 24 thus controls whether the logic level on output data bus 20 is presented at terminals DQ, or if output buffers 22 present a high-impedance state to terminals DQ.

AND gate 26, in this embodiment, has four inputs. A first input of AND gate 26 receives a chip enable signal from terminal CE which, at a high logic level, enables the operation of memory 1 and the operation of output buffers 22. Of course, as is well known in the art, the chip enable signal may be generated on-chip, for example from the logical combination of multiple enable signals, as is conventional for some circuits in the art. A second input received by AND gate 26 is the write enable signal received at terminal W—, inverted by inverter 28. Accordingly, when terminal CE selects memory in combination with write enable terminal W— at a high logic level, indicating a read operation, AND gate 26 can enable output buffers 22. Conversely, during a write operation indicated by write enable terminal W— at a low logic level, AND gate 26 will necessarily have a low logic level and will therefore necessarily place output buffers 22 in the high impedance state at their output. A third input received by AND gate 26 is an output enable signal from terminal OE, as is conventional in the art for enabling and disabling the output terminals; the use of an output enable signal is useful especially when multiple memories 1 have their output terminals connected together in wired-OR fashion.

The fourth input received by AND gate 26 in this embodiment is generated by parallel test circuitry 28. Parallel test circuitry 28, as will be explained in further detail hereinbelow, receives, on lines 30, multiple eight bit data words from input/output circuitry and column decoder 16; each of these data words corresponds to the data read from one of sub-arrays 12 according to a portion of the column address. Parallel test circuitry 28 performs the comparison of these multiple data words, and generates a signal on line 32 corresponding to whether or not the comparison was successful.

Parallel test circuitry 28 in FIG. 1 is shown as receiving a signal from terminal T, such signal enabling the parallel test mode of operation of memory 1. This is, of course, a simple technique for enabling the test mode of memory 1 (and disabling normal operation), but of course such a technique requires an additional terminal besides those necessary for normal memory operation. Other techniques for enabling this parallel test mode may alternatively be used to enable parallel test circuitry 28 according to the invention, such other techniques using on-chip logic circuitry to generate the test enable signal on line T. These alternative methods include the use of an overvoltage signal at one or more terminals which have other purposes during normal operation, such overvoltage indicating that the test mode is to be enabled. Another similar technique is described in the McAdams et al. article cited hereinabove, and includes the multiplexing of a test number onto address inputs while an overvoltage condition exists on a clock pin, the number selecting the parallel test mode (from other possible special test modes). Another alternative method, described in the Shimada et al. article cited hereinabove, applies a high voltage to a control pad while performing a write operation. It is contemplated that these and other techniques for placing memory 1 of this embodiment into test mode will be equally effective for purposes of this invention. Accordingly, for purposes of clarity, the simple technique of the use of terminal T for controlling the entry into test mode is shown in the Figures.

When enabled, parallel test circuitry 28 performs the comparison of the multiple data words presented thereto on lines 30, and generates a signal on line 32 corresponding to whether or not the comparison was successful. In this embodiment, line 32 is driven to a high logic level by parallel test circuitry 28 in test mode when the multiple data words all present the same data, and to a low logic level in test mode when there is an error, i.e., when the multiple data words compared do not present the same data. In order that output buffers 22 are operable during normal operation, parallel test circuitry 28 will present a high logic level during normal operation, i.e., when parallel test circuitry 28 is not enabled.

It should be apparent from FIG. 1 that memory 1 is a common input/output memory, and as such terminals DQ both present output data and receive input data. Terminals DQ are thus connected to input buffers 34, which during write operations present the input data to input data control circuitry 36, which will communicate the input data, via input data bus 38, to the selected memory cells via input/output control circuitry and column decoder 16. Input buffers 34 are controlled in a similar manner as output buffers 22 discussed hereinabove, with the enabling signal on line 40 generated by AND gate 42, which performs the logical AND of the from terminal W— (inverted by inverter 44). It should be noted that parallel test circuitry 28 does not, in this embodiment, affect the operation of the input buffers 34. In parallel test mode, input data may be written to multiple memory locations in memory 10 by input/output circuitry and column decoder 16 in the conventional manner, by enabling multiple memory locations and simultaneously writing the same data thereto.

Figure 2:
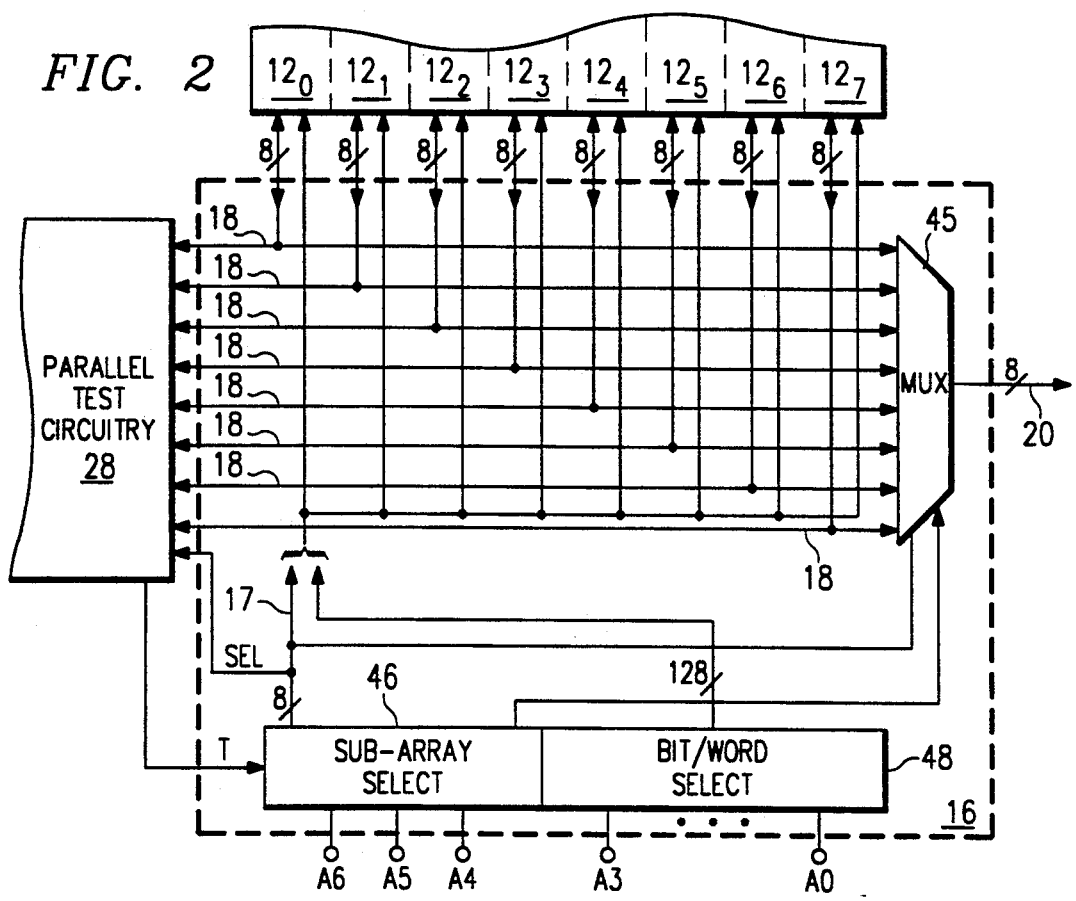
FIG. 2 is an electrical diagram, in block form, of the output data path including the parallel test circuitry according to the preferred embodiment of the invention.

Referring now to FIG. 2, the construction and operation of the output side of input/output circuitry and column decoder 16, as it interfaces with array 10 and with parallel test circuitry 28, will now be described. The construction of the input side of input/output circuitry and column decoder 16 is not shown in FIG. 2 for purposes of clarity; this portion may be constructed as conventional in the art for a memory of this organization, and may include provision for the parallel write of data in test mode if desired, as noted above.

In the embodiment illustrated in FIG. 2, the column decoder portion of input/output circuitry and column decoder 16 is considered in two portions, sub-array select 46, which selects a sub-array 12 according to the three most significant bits of the column address, and bit/word select 48, which selects the bits within the selected sub-array 12 according to the remainder of the column address Sub-array select 46 and bit/word select 48 may be constructed according to any one of a number of conventional address decoder designs The results of the decoding of the column address are communicated by control bus 17 to array 10. In the embodiment described herein, the selection of the bits within the selected sub-array 12 is accomplished in such a manner that local data bus 18 communicates only the data which corresponds to the selected memory location, which can be done, for example, by only enabling the sense amplifiers associated with the selected columns. Alternatively, in a memory organization where multiple columns share sense amplifiers, control bus 17 could select which columns are to be connected to each of eight sense amplifiers, and the output of all eight sense amplifiers per sub-array could be placed on local data bus 18. Further in the alternative, memory array 10 could include a sense amplifier for each column, where all sense amplifiers are activated for each operation in the selected sub-array, as is conventional for dynamic RAM devices. In such an alternative, control bus 17 would control which of the sense amplifiers are to be connected, for example by way of intermediate output buffers, to local data buses 18. It is contemplated that many further alternative arrangements, also capable of benefitting from this invention, will now be apparent to one of ordinary skill in the art. Such alternatives may include the connection of local data buses 18 to parallel test circuitry 28 at a location ahead of intermediate circuitry such as intermediate output buffers, so that the intermediate output buffers or other similar circuitry will, together with data bus 20, be in parallel with the comparison circuitry of parallel test circuitry 28.

Local data buses 18 from each sub-array 12 are connected to parallel test circuitry 28, such connections indicated generally as lines 30 in FIG. 1 (contemplating the alternative connections and arrangements discussed in the preceding paragraph). In addition, each local data bus 18 is connected to an input of multiplexer 45, which is connected at its output to data bus 20. Multiplexer 45 is controlled by sub-array select 46, so that during normal operation, sub-array select 46 will select one of the local data buses 18 for connection to output data bus 20, according to the three most significant bits of the column address.

It should be noted that, in this embodiment, single data lines are illustrated for carrying the sensed data state from array 10. It should be noted that complementary data lines may alternatively be used in local data buses 18, and in output data bus 20, for the communication of data within memory 1 as a differential signal. It should be noted, however, that the invention described herein does not require the use of complementary data lines in the comparison operation, as are required in the implementation of the Shimada et al. article referenced above. Accordingly, this embodiment of the invention can be implemented in an integrated circuit with fewer lines required for the communication of data internal to the memory.

According to this embodiment of the invention, sub-array select 46 also receives a signal T from parallel test circuitry 46 corresponding to the signal received at terminal T indicating that test mode operation is desired. Responsive to the indication of test mode by signal T, sub-array select 46 will enable multiple sub-arrays 12 to each sense stored data and place the sensed data on its associated local data bus 18. In this embodiment, as noted above, the word line signal for selecting a row in memory array is generated in normal operation in such a manner that only the portion of the word line which is associated with the selected sub-array 12 will be energized during the memory operation. Accordingly, during test mode, sub-array select 12 will also enable the word line for the multiple sub-arrays 12 to be enabled for parallel test. It should be noted that the enabling of multiple sub-arrays 12 by sub-array select 46 is necessary not only for a parallel read and compare operation, but also if a parallel write operation is desired For such a parallel write, sub-array select 46 will similarly enable multiple sub-arrays 12, for the simultaneous receipt of input data from input data bus 38 (shown in FIG. 1).

It should be noted that the number of sub-arrays 12 which are to be enabled during parallel test mode may vary, according to such factors as the number of parallel comparisons desired (the more bits read in parallel, the faster the test operation) and also the power consumption that can be tolerated during the test operation (the more bits read in parallel, the greater the power consumption). In this embodiment, the parallel test of four sub-arrays 12 has been found to be optimal; accordingly, if the most significant column address bit A6 indicates the left-half of array 10, then sub-arrays $12_0$ through $12_3$ will be enabled, while if the most significant column address bit A6 indicates the right-half of array 10, then sub-arrays $12_4$ through $12_7$ will be enabled. Of course, as is evident from FIGS. 1 and 2, the parallel test of all eight sub-arrays 12 may be performed, at a penalty of increased power consumption but, of course, with the benefit of further test time reduction.

Also responsive to this signal T indicating that the parallel test mode is enabled, sub-array select 46 controls multiplexer 45 so that one of local data buses 18 is selected for connection to output data bus 20, to the exclusion of the others, and without regard to the column address. As discussed above relative to FIG. 1, memory 1 according to this embodiment of the invention provides a high-impedance state at output terminals DQ responsive to a failed comparison during a parallel test read operation, such a high-impedance state generated by disabling output buffers 22. In addition, memory 1 according to this embodiment, in the event of a passing parallel test read operation, provides the actual data state stored at output terminals DQ. Of course, since multiple sub-arrays 12 are enabled in such a test, the value of one of local data buses 18 is sufficient for presenting the actual data state in a passing test. Furthermore, according to this embodiment of the invention, since a failed test is indicated by a high-impedance state (rather than by a particular data state), it has been found that it is not necessary, and indeed is undesirable from an access time standpoint, to wait for the comparison of the multiple data words to indicate a pass before sending the actual stored data to output buffers 22. Accordingly, the selection of one of local data buses 18 for connection to data bus 20 in test mode may be "hardwired", since in the event of a pass all local data buses 18 have the same data, and in the event of a fail the data on data bus 20 will not be presented anyway. Accordingly, sub-array select 46 will control multiplexer 45 to select, in test mode, one of local data buses 18 regardless of the address value.

Sub-array select 46, in test mode, also controls the operation of parallel test circuitry 28, as will be described in further detail hereinbelow. As noted above, in the preferred embodiment of the invention, the parallel test is accomplished by way of comparing the output from four of the eight sub-arrays 12. Accordingly, by way of control line (or lines, as the case may be) SEL, sub-array select 46 communicates to parallel test circuitry 28 which four of eight local data buses 18 are to be compared during the parallel test operation.

Figure 3:
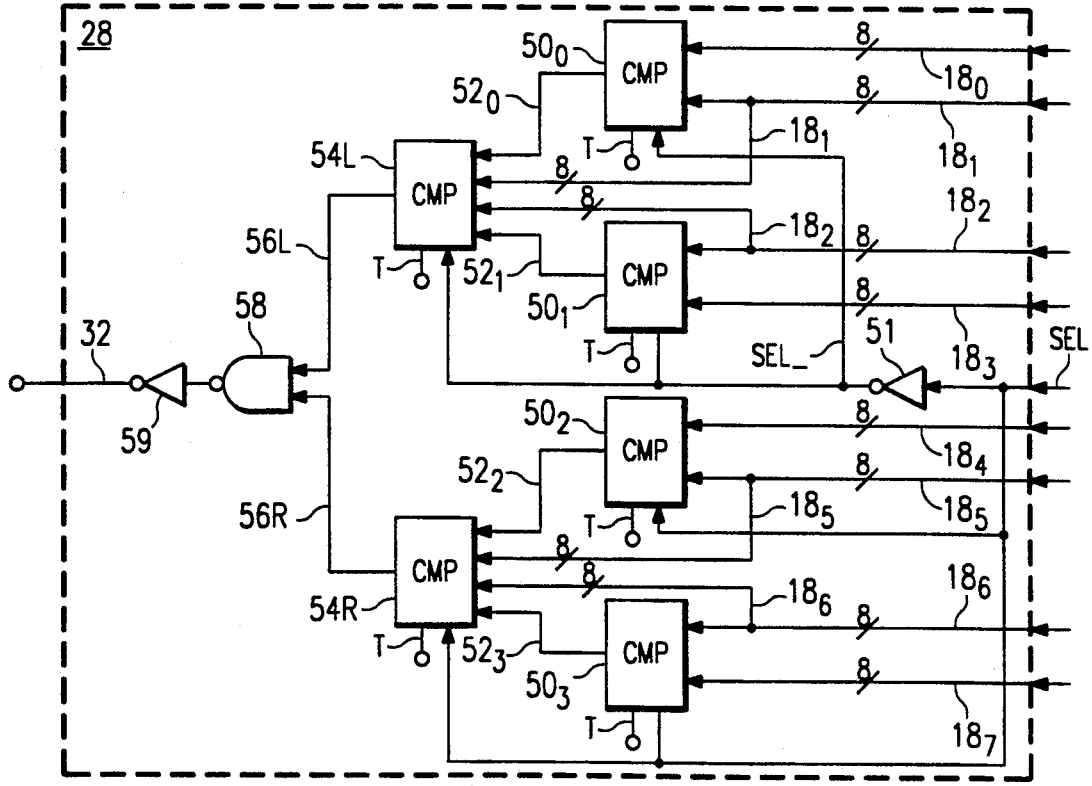
FIG. 3 is an electrical diagram, in block form, of the parallel test circuitry of FIG. 2.

Referring now to FIG. 3, the construction and operation of parallel test circuitry 28 will be described in detail. Parallel test circuitry 28, as noted above, receives a signal on line T from terminal T, and on line SEL from sub-array select 46. As noted above, in this embodiment the parallel test is performed on data from four sub-arrays 12 at a time. Accordingly, line SEL is at a high logic level to indicate the selection of sub-arrays $12_4$ through $12_7$, and at a low logic level to indicate the selection of sub-arrays $12_0$ through $12_3$.

Parallel test circuitry 28 further receives local data buses 18, illustrated in FIG. 3 as local data buses $18_0$ through $18_7$, corresponding to sub-arrays $12_0$ through $12_7$. Comparator $50_0$ receives local data buses $18_0$ and $18_1$, and performs a bit-by-bit comparison of the two data words presented thereupon; comparator $50_0$ also receives enabling signals on line T, which indicates that the parallel test mode is enabled, as described above, and also on line SEL__ from sub-array select 46 via inverter 51. Similarly, comparator $50_1$ receives and performs a bit-by-bit comparison of local data buses $18_2$ and $18_3$, comparator $50_2$ receives and compares local data buses $18_4$ and $18_5$, and comparator $50_3$ receives and compares local data buses $18_6$ and $18_7$. Each of comparators 50 presents a signal on its output line 52 which indicates a passing comparison with a high logic level and a failing comparison with a low logic level.

Figure 4:
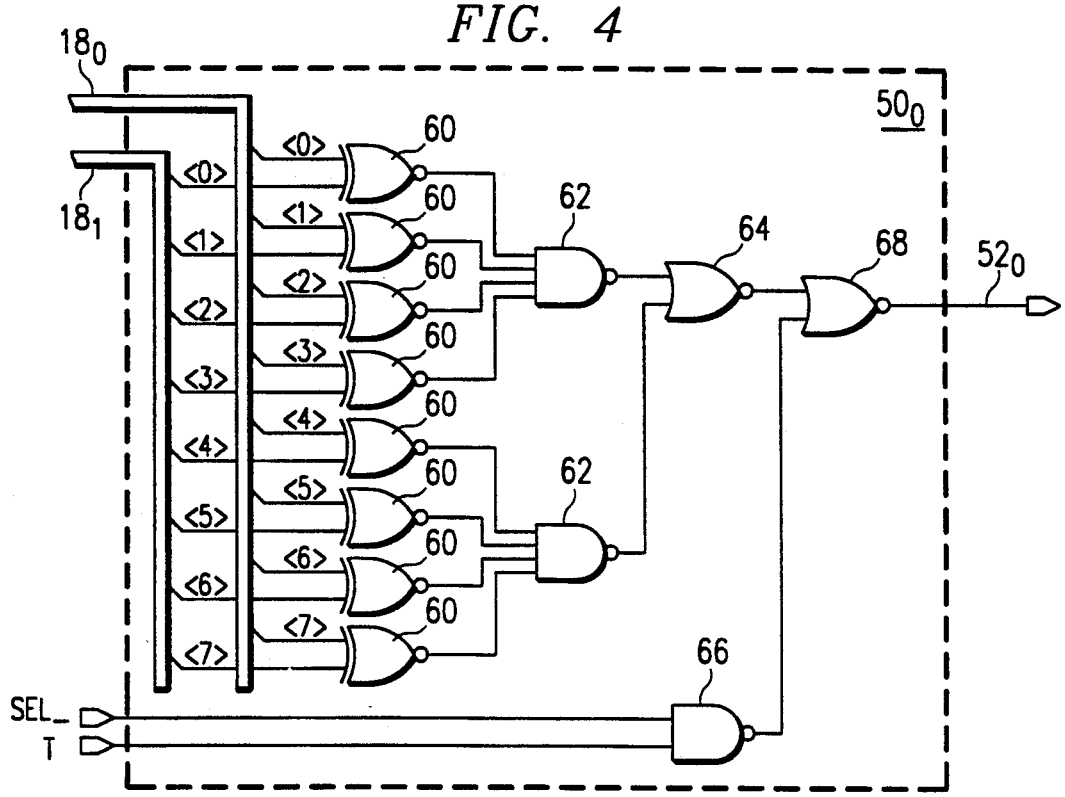
FIG. 4 is an electrical diagram, in schematic form, of a comparator in the diagram of FIG. 2.

Referring to FIG. 4, the construction and operation of a comparator 50, for example comparator $50_0$, will be described in detail. In this embodiment, each comparator 50 is constructed alike, and as shown in FIG. 4. Comparator $50_0$ includes eight exclusive-NOR (XNOR) gates 60. Each XNOR gate 60 receives one line from each of the local data buses $18_0$ and $18_1$, corresponding to one bit of the data word carried by local data buses 18. As is shown in FIG. 4, the data lines received by each XNOR gate 60 from the two local data buses 18 correspond to the same bit position (i.e., the top XNOR gate 60 in FIG. 4 receives bit 0 from each of local data buses $18_0$ and $18_1$). The eight XNOR gates 60 thus accomplish the bit-by-bit comparison of each of the data lines for the local data buses under comparison by comparator 50.

The outputs of XNOR gates 60 are communicated to combinational logic, in this case consisting of NAND gates 62 and NOR gate 64. In this embodiment, four XNOR gates 60 present their output to one NAND gate 62. Since XNOR gates 60 will present a high logic level if both inputs are the same and a low logic level if the two inputs differ, the output of a NAND gate 62 will be at a low logic level only if all four of the XNOR gates 60 at its inputs present a high logic level thereto. The outputs of NAND gates 62 are connected to inputs of NOR gate 64, such that NOR gate 64 will present a high logic level only if both NAND gates 62 present a low logic level at their outputs. A high logic level at the output of NOR gate 64 thus indicates that the bit-by-bit comparison of the two local data buses 18 was successful, i.e., they are each carrying identical data relative to one another. It should be apparent from this description that the actual data state communicated by local data buses 18 is not important, and that the value of the data communicated thereby is not important (i.e., each of the bits in the data word need not be the same) in the comparison performed by comparators 50. Accordingly, various patterns of data words may be tested according to this embodiment of the invention.

Comparators 50 also include enabling logic, so that lines SEL (or SEL__) and T may enable or disable the comparison. As shown in FIG. 4, NAND gate 66 receives at its input, for comparator $50_0$, lines T and SEL__. The output of NAND gate 66 thus is at a low logic level responsive to both of lines T and SEL__ being at a high logic level; if either line T or line SEL__ are low, NAND gate 66 will present a high logic level at its output. The outputs of NAND gate 66 and of NOR gate 64 are connected to inputs of NOR gate 68, which drives line $52_0$, the output of comparator $50_0$. Accordingly, line $52_0$ is at a low logic level either if comparator $50_0$ is not selected (i.e., the output of NAND gate 66 is at a high logic level) or if comparator $50_0$ is enabled and if the comparison is successful (i.e., the output of NOR gate 64 is at a high logic level). Comparator $50_0$ thus only presents a high logic level on line $52_0$ when it is enabled (i.e., the output of NAND gate 66 is at a low logic level) and the comparison fails (i.e., the output of NOR gate 64 is at a low logic level).

Of course, the first stage of comparison performed by comparators 50 compares pairs of local data buses 18 together, but does not accomplish the comparison of all four of local data buses 18 which are selected by subarray select 46 in test mode. Second stage comparators 54L and 54R are thus incorporated into parallel test circuitry 28 to complete the comparison. Comparator 54L receives the output lines $52_0$ and $52_1$ from comparators $50_0$ and $50_1$, respectively. Comparator 54L also receives local data buses $18_1$ and $18_2$, as well as enabling signals on lines T and SEL__. Comparator 54L makes a bit-by-bit comparison of local data buses $18_1$ and $18_2$, and determines if the comparison by comparators $50_0$ and $50_1$ were both successful. If so, comparator 54L generates a high logic level signal at its output on line 56L. In this fashion, comparator 54L makes the determination that the data on local data bus $18_0$ matches that on local data bus $18_1$, that the data on local data bus $18_2$ matches that on local data bus $18_3$, and that the data on local data bus $18_1$ matches that on local data bus $18_2$. These three comparisons are sufficient to ensure that the data on all four data buses $18_0$ through $18_4$ match one another on a bit-by-bit basis.

Comparator 54R similarly receives local data buses $18_5$ and $18_6$, as well as output lines $52_2$ and $52_3$ from comparators $50_2$ and $50_3$, respectively, to complete the bit-by-bit comparison of local data buses $18_4$ through $18_7$. Of course, comparator 54R is enabled by line T and line SEL, rather than line SEL__ as is the case for comparator 54L. The output of comparator 54R on line 56R is at a high logic level in the event of a successful comparison, and at a low logic level in the event of a failed comparison.

Figure 5:
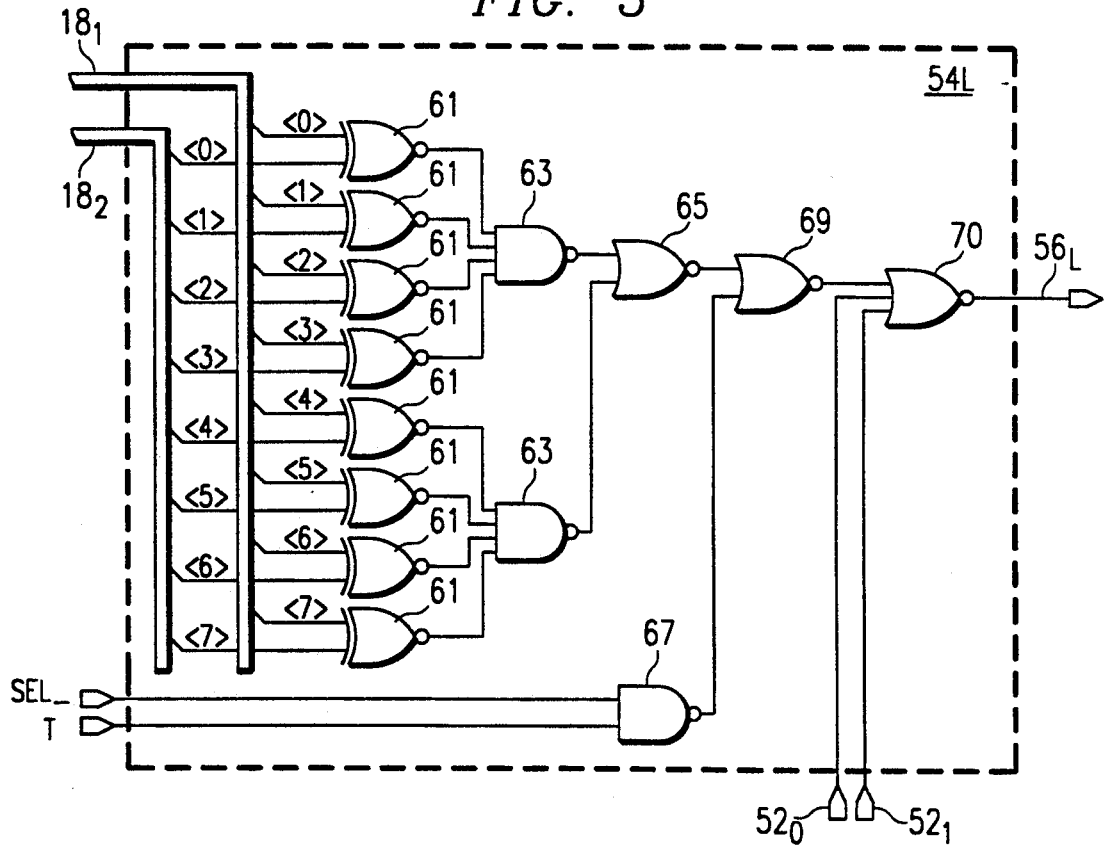
FIG. 5 is an electrical diagram, in schematic form, of a later-stage comparator in the diagram of FIG. 2.

Referring to FIG. 5, the construction and operation of comparators 54 will be described in detail, with reference to comparator 54L. In this embodiment, comparator 54R is similarly constructed, except for being enabled by line SEL rather than line SEL__. Comparator 54L receives local data buses $18_1$ and $18_2$, at the inputs of its XNOR gates 61. The set of XNOR gates 61 perform a bit-by-bit comparison of the two local data buses 18, and each of XNOR gates 61 indicates a true comparison by a high logic level at its output and a false comparison by a low logic level. In the similar manner as described above relative to comparator 50, the results of the bit-by-bit comparison performed by XNOR gates 61 are communicated to NAND gates 63, each of which present a low logic level only if all of the outputs of XNOR gates 61 connected thereto are at a high logic level. The outputs of NAND gates 63 are connected to the inputs of NOR gate 65 which, as in the case described above, presents a low logic level if the full bit-by-bit comparison of local data buses $18_1$ and $18_2$ is successful. Also similarly as in the case of comparator 50, NAND gate 67 receives the enable inputs on lines SEL__ and T, and presents at its output a low logic level if both inputs are at a high logic level, indicating enabling of comparator 54L. Accordingly, NOR gate 69, which receives at its input the outputs of NOR gate 65 and NAND gate 67, will present a low logic level either if comparator 54L is not enabled, or if comparator 54L is enabled and the bit-by-bit comparison of local data buses $18_1$ and $18_2$ passes.

In addition to the circuitry also contained in comparator 50 for the bit-by-bit comparison of two local data buses 18, comparator 54L includes NOR gate 70. NOR gate 70 receives the output of NOR gate 69, and also receives at its inputs line $52_0$ from comparator $50_0$ and line $52_1$ from comparator $50_1$. NOR gate 70 drives line 56L at its output. Accordingly, NOR gate 70 presents a high logic level on line 56L if the bit-by-bit comparisons performed by comparators 54L, $50_0$ and $50_1$ all pass (i.e., all inputs to NOR gate 70 are at a low logic level), or if comparators 54L, $50_0$ and $50_1$ are not enabled. If comparators 54L, $50_0$ and $50_1$ are all enabled, and if any of the bit-by-bit comparisons performed thereby fail (indicated by a high logic level presented to an input of NOR gate 70), line 56L will be driven to a low logic level.

Lines 56L and 56R are communicated to the inputs of a NAND gate 58 which generates, via inverter 59, the signal on line 32 which is connected to the input of AND gate 26 (shown in FIG. 1) for controlling the enabling of output buffers 22. Accordingly, line 32 will be driven to a high logic level responsive to both of lines 56L and 56R at a high logic level. As is evident from the above description, comparators 54 drive their output lines 56 to a high logic level when not selected (i.e., either line T or the appropriate line SEL is at a low logic level), or when selected in the event of a successful comparison. As described above relative to FIG. 1, this condition will allow output buffers 22 to be enabled. Since multiplexer 45 (FIG. 2) is enabled by sub-array select 46 in test mode to select one of the local data buses 18 from one of the sub-arrays 12 in the selected group of four (in this example), the data presented on that local data bus 18 is presented to output buffers 22 by way of data bus 20. With output buffers 22 enabled, this data then appears at the output terminals DQ as the data word read from the selected memory locations of memory 1.

Conversely, line 32 is at a low logic level only in the event that a parallel test operation is enabled (by line T), and that the comparison failed as indicated by the selected one of comparators 54. As described above relative to FIG. 1, a low logic level on line 32 will cause the output of AND gate 26 to be at a low logic level, which in turn disables output buffers 22. While multiplexer 45 is still operable to connect one of local data buses 18 to data bus 20 and thus to output buffers 22 (regardless of the comparison), the low logic level on line 32 from parallel test circuitry 28 will disable output buffers 22, and place them in the high-impedance state. In this way, a failed result of the parallel test read operation is communicated externally from memory 1.

The prior technique of presenting a high impedance state at the output described in the Shimada et al. article discussed hereinabove requires that one arbiter buffer be able to pull down the data bus in contention with n−1 arbiter buffers, in order to communicate a failing result for an n-bit parallel test. As noted above, this is done by the use of small pull-up devices in the arbiter buffers. These small devices necessarily will affect device performance not only during parallel test, but also during normal operation, since the arbiter buffers are in series with the output data path. As noted above, according to this technique these small pull-up devices must become even smaller relative to the pull-down devices as the number n increases, in order for the wired-AND function to operate. Accordingly, the degrading effect of this technique on the performance of the memory is made even worse as the number of bits tested in parallel increases.

The comparison scheme according to t embodiment of the invention is implemented without signific affecting the normal operation of memory since parallel circuitry 28 is connected in parallel with the output data. Accordingly, the number of memory locations tested in par according to this invention can be increased to any de number, with no additional degradation in access time performance.

It should be noted that this embodiment of the invention presents a high-impedance state at all eight of output terminals DQ in the event of a failed comparison. Alternatively, additional logic could be used so that only the DQ terminal associated with the bit position (or positions) for which the comparison failed entered the high-impedance state. Such an implementation would assist in failure analysis, for example by allowing the automatic logging by automated test equipment of which outputs fail most often. Such additional logic would, of course, require additional area on the integrated circuit chip for its implementation. It should further be noted that the embodiment described hereinabove, especially if embedded in a microprocessor or other logic device, could provide further additional information to the logic which could further allow automated failure analysis.

It should further be noted that the above embodiment of the invention implements the parallel read operation in the non-expected data mode, i.e., where the test is performed by only comparing the contents of the memory locations against one another to determine if they match. Alternatively, by provision of an on-chip latch, and an additional level of comparison in parallel test circuitry 28, the contents of local data buses 18 could be compared against an expected data value, so that the value of the data stored in the memory locations could be compared not only with one another, but also with the value which is expected to be stored therein. It is contemplated that this alternative implementation can be easily implemented, if desired, by one of ordinary skill in the art having reference to this specification and the drawings.

It should further be noted that the block diagrams of this embodiment of the invention, illustrating the electrical placement of the circuits, may not necessarily correspond to the physical layout and placement of the circuitry on an actual memory 1. For example, relative to FIGS. 2 through 5, it has been found that portions of parallel test circuitry 28 are preferably physically located near sub-arrays 12, so that the number of physical lines running along the length of the array 10 can be reduced. For example, comparators 50, and the portions of comparators 54 which compare the data states of local data buses 18, are preferably located in the interface regions between adjacent sub-arrays 12; the remaining portions of comparators 54 are preferably physically located in the space between array 10 and input/output circuitry and column decoder 16. Furthermore, it should be noted that the layout of sub-arrays 12 may not correspond to that shown in FIG. 1; for example, the eight sub-arrays 12 may be placed in such a manner that input/output circuitry and column decoder 16 is physically located between groups of sub-arrays 12, and similarly row decoder 14 may be physically located between groups of sub-arrays 12. It is contemplated that such layout optimization can be determined by one of ordinary skill in the art according to the particular parameters of interest for the specific memory design and manufacturing processes.

Figure 6A:
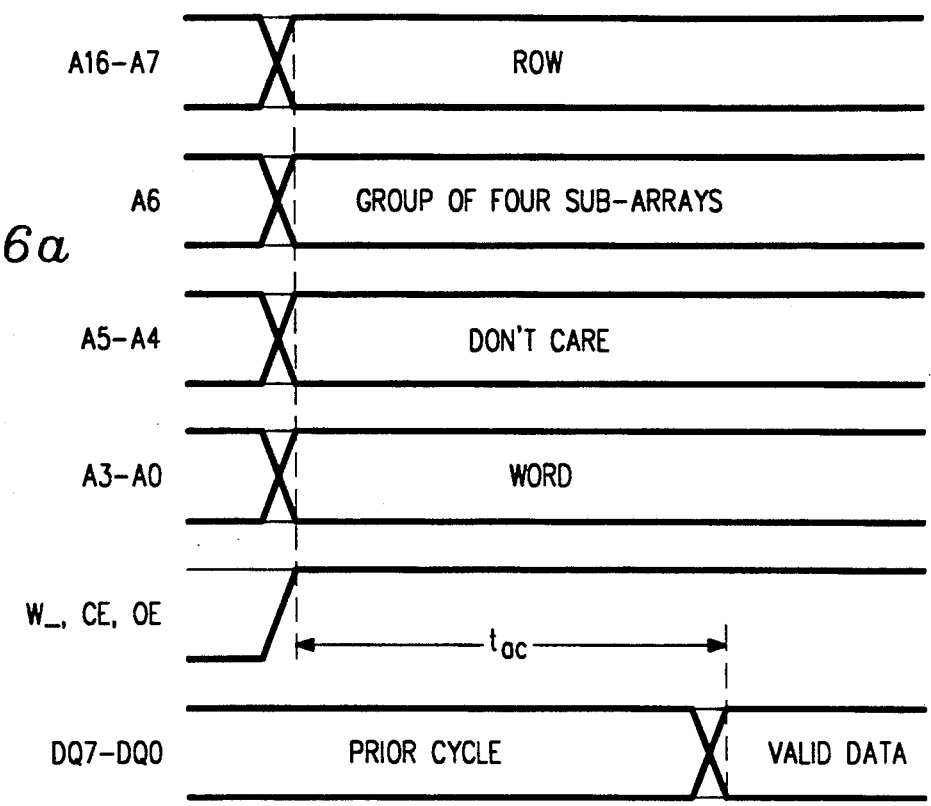
FIGS. 6a and 6b are timing diagrams illustrating the operation of the preferred embodiment of the invention, both for the failing and for the passing condition.
Figure 6B:
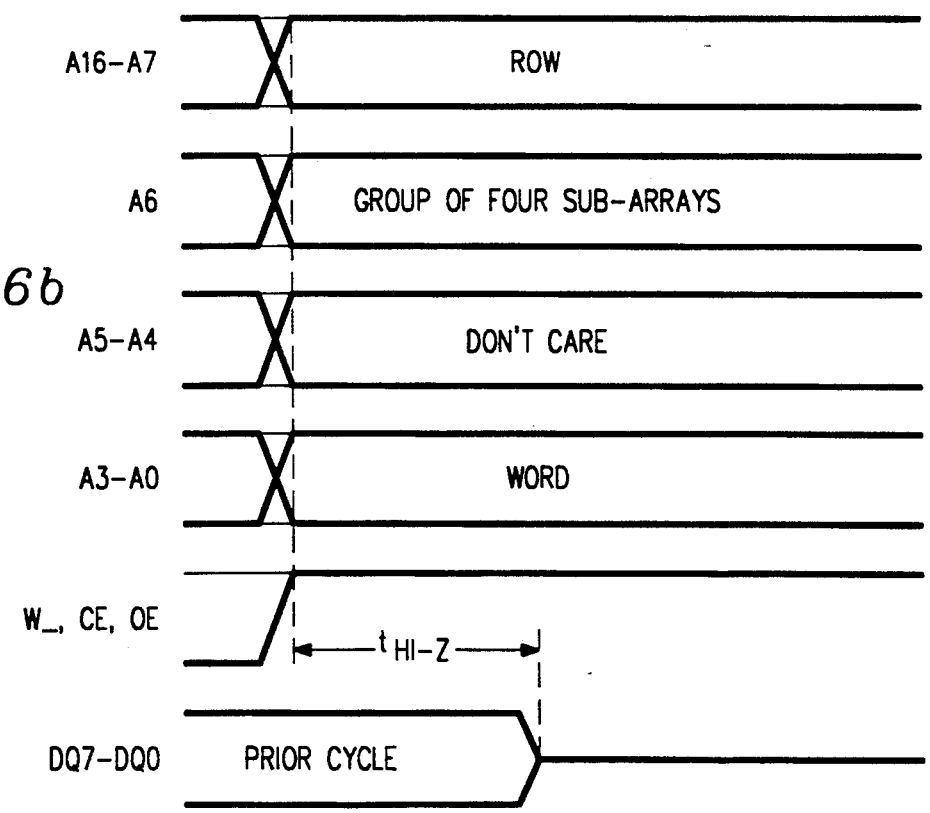

Referring now to FIGS. 6a and 6b, the operation of memory 1 including the preferred embodiment described hereinabove, as it appears external to memory 1, will be described with reference to timing diagrams. FIG. 6a illustrates the case where the parallel test operation passes, and FIG. 6b illustrates the case of a failed parallel test read operation. Each of FIGS. 6a and 6b begin with memory 1 already in parallel test mode, according to the conventional manner.

Referring to FIG. 6a, the address terminals A16 through A0 all make the transition from their prior value to the value corresponding to the desired memory locations to be read in the parallel test read operation. It should be noted that address terminals A16 through A7 select the desired row, and address terminals A3 through A0 select the desired word. In normal operation, address terminals A6 through A4 select one of the eight sub-arrays 12 to be energized and enabled. In this embodiment, however, since four sub-arrays 12 are to be energized and read from (and, in the case of a parallel write, written to), the most significant of these three address terminals, namely A6, selects the group of four sub-arrays 12 to be accessed. The remaining address terminals A5 and A4 are don't cares for this operation, as they are used in normal operation to select which of the four sub-arrays 12 in the group of four is to be energized. Since this is a read operation, all of terminals W_, OE and CE are taken to a high logic level, and the cycle begins.

FIG. 6a illustrates the timing for a successful parallel read operation. As such, after the access time $t_{AC}$ has elapsed (such access time can be measured from address transition or from chip enable, as is conventional; in this example these two events are shown as simultaneous, for ease of explanation), the data read from the selected location in memory 1 appears at output terminals DQ7 through DQ0. As noted above, the selection of the sub-array 12 to be accessed in this operation is hard-wired, since all local data buses 18 carry identical data when the test is successful. The next cycle can then be effected, at the desired time in the conventional manner. In the example of FIG. 6a, output terminals DQ are shown as having data from a prior cycle thereat, prior to the presentation of valid data from the new cycle. It is contemplated, of course, that this test can be performed with output terminals DQ in a high-impedance state at the beginning of the cycle, with the valid data being driven thereat in the conventional manner after the access time $t_{AC}$.

It should be noted that, in this embodiment, the time $t_{AC}$ at which the parallel data appears at terminals DQ will be identical, in parallel test mode, to the read access time of memory 1 during normal operation. This is because the circuitry for making the comparison of the parallel data words is not connected in series with the normal data output path of the circuit, but is in parallel therewith. It is expected that the comparison performed by parallel test circuitry 28 can be done in less time than is required for the data to be presented at output terminals DQ, so that output buffers 22 will be enabled in sufficient time for the access time specification to be met. Accordingly, in this embodiment of memory 1, the timing and operation of the data output path in the parallel test operation is exactly the same as in normal operation.

It should further be noted that parallel test circuitry 28 according to the invention is not in series with the data output path used both in normal operation, and in communicating the actual data state during parallel test operation. Rather, parallel test circuitry 28 compares the state of local data buses 18 in parallel with the communication of data through multiplexer 45 to output buffers 22 via data bus 20. Accordingly, in normal operation, the circuitry required for the parallel test comparison does not compromise the access time performance of memory 1.

FIG. 6b illustrates the timing for a failed parallel read operation according to this embodiment. The input signals on the address and control terminals are, of course, identical in this case as in FIG. 6a noted above. As shown in FIG. 6b, output terminals DQ7 through DQ0 all go to a high impedance state at time $t_{HI-Z}$ after the address transition and chip enable time. This, as described above, indicates that the parallel read operation has failed. It should be noted, however, that the time $t_{HI-Z}$ can be shorter than the access time $t_{AC}$, since the time required for charging up the data buses 20 and output buffers 22 is not necessary for the output terminals DQ to enter the high-impedance state.

It should be noted, however, that it is not essential that the comparison be performed by parallel test circuitry 28 in such a short time. For example, if the data from the selected local data bus 18 were presented at output terminals DQ prior to the completion of the comparison, the failed test would still be indicated by output terminals DQ subsequently entering the high-impedance state. In such a case, of course, the external tester or user would have to be notified by specification of the time at which the test result would be communicated.

While the invention has been described herein relative to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A method of parallel testing a plurality of memory locations in an integrated circuit, comprising:
   selecting a plurality of memory locations;
   comparing the contents of said selected memory locations;
   communicating the contents of a first one of the selected memory locations to an output buffer of the integrated circuit during said comparing step; and
   disabling the output buffer from presenting the communicated contents of the first one of the selected memory locations, responsive to the result of the comparing step indicating that the contents of the selected memory locations do not all match one another.

2. The method of claim 1, wherein said comparing step comprises:
   comparing first and second ones of said memory locations with one another;
   comparing third and fourth ones of said memory locations with one another; and
   comparing said second and third ones of sad memory locations with one another.

3. The method of claim 2, wherein said selecting step comprises:

selecting a plurality of memory cells according to a portion of a column address so that the contents of said memory cells are communicated to local data buses;

and wherein said local data buses each comprise a plurality of data lines, each for communicating the contents of a memory cell.

4. The method of claim 3, wherein said selecting step selects a plurality of data words; and wherein each of said data words comprises a plurality of bits.

5. The method of claim 4, wherein the number of data lines of said local data buses equals the number of bits in said data words;

wherein the number of local data buses is greater than the number of selected data words;

and wherein said selecting step further comprises:

selecting a comparator from a plurality of comparators, corresponding to the number of data words selected.

* * * * *